(12) United States Patent
Baidya et al.

(10) Patent No.: US 7,611,806 B2
(45) Date of Patent: Nov. 3, 2009

(54) SUB-WAVELENGTH DIFFRACTIVE ELEMENTS TO REDUCE CORNER ROUNDING

(75) Inventors: Bikram Baidya, Hillsboro, OR (US); Vivek Singh, Portland, OR (US); Yan Borodovsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 679 days.

(21) Appl. No.: 11/242,166

(22) Filed: Sep. 30, 2005

(65) Prior Publication Data

US 2007/0077500 A1    Apr. 5, 2007

(51) Int. Cl.
*G03F 1/00* (2006.01)
(52) U.S. Cl. .......................................... 430/5
(58) Field of Classification Search .............. 430/5, 430/311, 312, 313, 394; 716/19, 20, 21
See application file for complete search history.

(56) References Cited

U.S. PATENT DOCUMENTS

| 6,165,693 A * | 12/2000 | Lin et al. ............... 430/311 |
| 7,197,722 B2 | 3/2007 | Wong |
| 7,285,781 B2 | 10/2007 | Cao |
| 2007/0094959 A1 | 5/2007 | Hu |

* cited by examiner

*Primary Examiner*—Stephen Rosasco
(74) *Attorney, Agent, or Firm*—George Chen (57) ABSTRACT

The present invention discloses a mask including: a first region near a corner of a feature, the first region including a first element, the first element being transparent to a light, the first element having a side that is smaller than a wavelength of said light; a second region near the corner of the feature, the second region including a second element, the second element being transparent to the light, the second element having a side that is smaller than the wavelength of the light; and a third region near the corner of the feature, the third region including a third element, the third element being opaque to the light, the third element having a side that is smaller than the wavelength of the light.

12 Claims, 8 Drawing Sheets

SUB-WAVELENGTH DIFFRACTIVE ELEMENTS TO REDUCE CORNER ROUNDING

BACKGROUND OF THE INVENTION

1. Field of the Invention

The present invention relates to semiconductor integrated circuit (IC) manufacturing, and more specifically, to a mask with sub-wavelength diffractive elements to reduce corner rounding and a method of designing such a mask with sub-wavelength diffractive elements to reduce corner rounding.

2. Discussion of Related Art

Improvements in photolithography have allowed higher density and faster speed to be attained in integrated circuits (ICs) by continually shrinking the devices in a chip. According to a Rayleigh criterion, a smallest dimension that can be resolved by an imaging tool is directly proportional to a wavelength of exposure light and inversely proportional to the numerical aperture (NA) of the projection optics. However, diffraction may degrade the aerial image when a critical dimension (CD) becomes smaller than the wavelength of the light used to expose a photoresist film on a wafer. The exposure light may include deep ultraviolet (DUV) light with a wavelength of 248 nanometers (nm) or 193 nm.

Photolithography in the sub-wavelength regime will benefit from wavefront engineering using a resolution enhancement technique (RET), such as a phase-shifting mask (PSM), to achieve a sufficiently wide process latitude.

However, as the CD is scaled down, a mask may become unable to print the product features accurately enough. Consequently, other techniques may be needed to enhance fidelity of the pattern printed on the wafer.

In particular, optical proximity correction (OPC) may be used to modify the product features in the patterns on the mask to compensate for variations and non-uniformities in the fabrication process for the layer of the chip.

When traditional OPC is applied to the design of the mask, certain sub-resolution assist features, such as serifs and anti-serifs, may be used to modify the edges of the product features. Other sub-resolution assist features, such as scattering bars, may be placed close by to the product features.

Empirically-derived rules may be formulated for OPC to help define product features that cannot otherwise be reproduced reliably during manufacturing. However, as features shrink in size, many conflicts may arise in applying the rules. Consequently, a mask, such as PSM with OPC, may become complex to design.

Thus, what is needed is a mask with sub-wavelength diffractive elements to reduce corner rounding and a method of designing such a mask with sub-wavelength diffractive elements to reduce corner rounding.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a mask with sub-wavelength diffractive elements to reduce corner rounding and a method of designing such a mask with sub-wavelength diffractive elements to reduce corner rounding.

Figure 1:
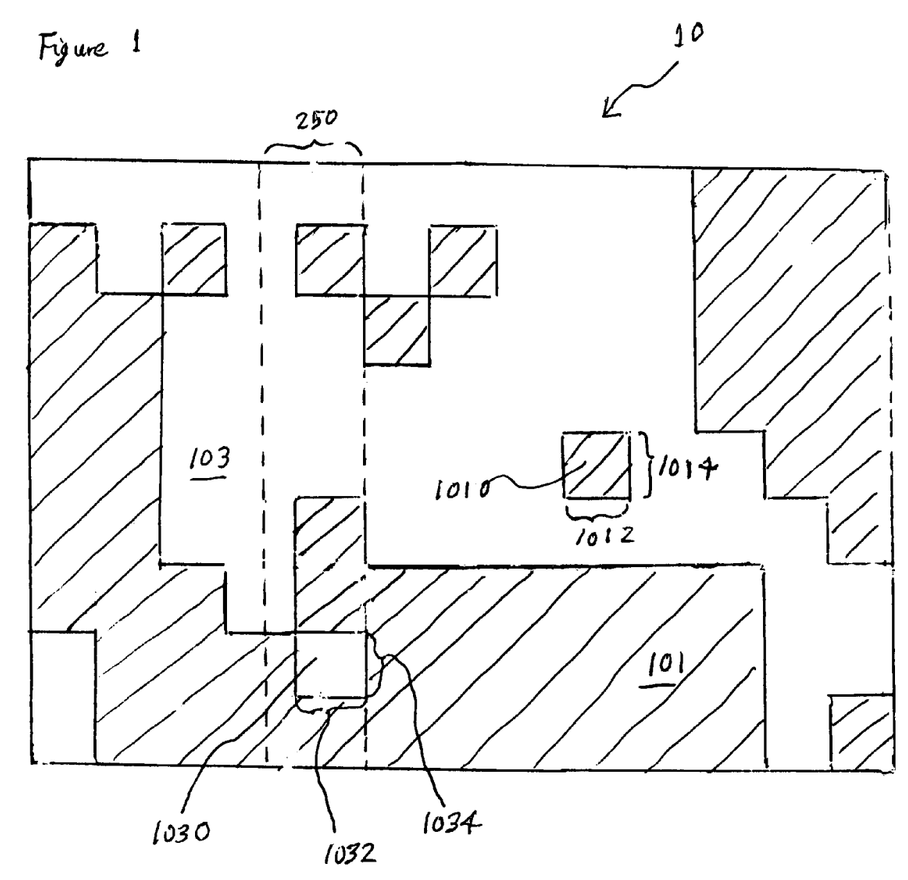
FIG. 1 is an illustration of a mask with sub-wavelength diffractive elements to reduce corner rounding according to an embodiment of the present invention.

As shown in an embodiment of the present invention in FIG. 1, a mask 10 may include a binary mask, such as a chrome-on-glass (COG) mask. The binary mask modulates amplitude of incident light.

In an embodiment of the present invention, the mask may include a phase-shifting mask (not shown). The phase-shifting mask (PSM) modulates phase, as well as amplitude, of incident light to use destructive interference to reduce the detrimental effects of diffraction. In particular, contrast between exposed and unexposed regions of the photoresist film may be enhanced by introducing a phase difference of 180 degrees between the light transmitted through adjacent clear openings of the mask to force amplitude of light between the two corresponding images to zero.

In an embodiment of the present invention, the mask may include an alternating phase-shifting mask (not shown). The alternating phase-shifting mask (AltPSM) is a strong-type of PSM that may be used for patterning a gate length of a device.

In an embodiment of the present invention, the mask may include an attenuated phase-shifting mask (not shown). The attenuated phase-shifting mask (AttPSM) is a weak-type of PSM that may be used for patterning a contact of the device.

As shown in an embodiment of the present invention in FIG. 1, the mask 10 may include an array of elements 1010, 1030. In an embodiment of the present invention, an element may include a shape, a size, and a state.

In an embodiment of the present invention, the element may include a square shape. For features with Manhattan geometry, a side of the square may be oriented parallel to the x-axis or the y-axis. For features with X-architecture, a side of the square may be rotated, such as by 45 degrees, either clockwise or counterclockwise, from the x-axis or the y-axis.

For features with both Manhattan geometry and X-architecture, a side of the square may be oriented parallel to the x-axis, the y-axis, or rotated, such as by 45 degrees, depending on which features are more predominant or more critical on the mask. In an embodiment of the present invention, a phenomenon of "staircasing" along edges of certain features may be minimized by reducing the size of the element.

The state of an element may include a transmittance and a phase to modulate incident light. In an embodiment of the present invention, the incident light may have a wavelength selected from a range of 170-260 nanometers (nm), such as 193 nm or 248 nm. In an embodiment of the present invention, a mask substrate that includes quartz may be transparent at such a range of wavelengths.

In an embodiment of the present invention, the incident light may have a wavelength selected from a range of 115-170 nm, such as 126 nm or 157 nm. In an embodiment of the present invention, a mask substrate that includes low-hydroxyl quartz may be transparent at such a range of wavelengths. In an embodiment of the present invention, a mask substrate that includes fluorine-doped quartz may be transparent at such a range of wavelengths. In an embodiment of the present invention, a mask substrate that includes calcium fluoride may be transparent at such a range of wavelengths.

The element may be a clear element or an opaque element 1010. As shown in an embodiment of the present invention in FIG. 1, the opaque element 1010 may have a rectangular (or a square) shape with a horizontal side 1012 and a vertical side 1014. The clear element may be a transparent element 1030 or a translucent element (not shown). As shown in an embodiment of the present invention in FIG. 1, the transparent element 1030 may have a rectangular (or square) shape with a horizontal side 1032 and a vertical side 1034. The definition of horizontal or vertical may depend on orientation.

In an embodiment of the present invention, the clear element may include a phase of zero degree, such that incident light may be transmitted with its phase unchanged. In an embodiment of the present invention, the clear element that is not phase-shifted may include quartz 103, such as a quartz mask substrate with a thickness of 0.25-inch.

In an embodiment of the present invention, the clear element may include a phase of 180 degrees, such that incident light may be transmitted with its phase reversed. In an embodiment of the present invention, the clear element that is phase-shifted may include the 0.25-inch thick quartz mask substrate with its thickness increased (such as by depositing a film to add a first quantity of quartz) or decreased (such as by etching a trench to remove a second quantity of quartz).

Designation of the phase may depend on defined reference and selected orientation (such as incidence angle relative to a surface of the mask 10). The phase of the clear element may be shifted, in a positive or negative direction, by an amount such as 30 degrees, 45 degrees, 60 degrees, or 90 degrees.

In an embodiment of the present invention, the clear element may be a transparent element 1030. In an embodiment of the present invention, the transparent element may have a high transmittance of 95-99%, so that nearly all of the incident light is transmitted. As shown in an embodiment of the present invention in FIG. 1, the transparent element 1030 may include the quartz 103 substrate. In an embodiment of the present invention, the transparent element 1030 may include the low-hydroxyl quartz or fluorine-doped quartz.

In an embodiment of the present invention, the clear element may be a translucent element (not shown). In an embodiment of the present invention, the translucent element may have a low transmittance of 5-15%, so that most of the incident light is blocked. In an embodiment of the present invention, the translucent element (not shown) may include a weak absorber or a thin absorber, such as 60-nm thick chrome or molybdenum silicide, overlying the quartz mask substrate. In an embodiment of the present invention, the translucent element may include an inefficient reflector or a thin reflector.

In an embodiment of the present invention, the element may be opaque, such as with a very low transmittance of 1% or less, so that nearly all of the incident light is blocked. As shown in an embodiment of the present invention in FIG. 1, the opaque element 1010 may include a strong absorber or a thick absorber, such as 100-nm thick chrome 101, overlying the quartz mask substrate. In an embodiment of the present invention, the opaque element may include an efficient reflector or a thick reflector.

The opaque element 1010 and the clear element, such as a transparent element 1030, on the mask 10 may include a size that is smaller than a wavelength of light produced by a light source in a wafer scanner or stepper. Consequently, in an embodiment of the present invention, the opaque element and the clear element on the mask 10 may serve as sub-wavelength diffractive elements (arranged in an array) to form an aerial image from the light produced by the light source.

The size of an element 1010, 1030 with a square shape on the mask 10 may depend on the length of the side. In an embodiment of the present invention, the side of the square may be 35-70% of the wavelength of the light from the light source. In an embodiment of the present invention, the side of the square may be 15-35% of the wavelength of the light from the light source. In an embodiment of the present invention, the side of the square may be 5-15% of the wavelength of the light from the light source. In an embodiment of the present invention, the side of the square may be 2-5% of the wavelength of the light from the light source.

The size of the element 1010, 1030 with a square shape on the mask 10 may depend on the length of the side. In an embodiment of the present invention, the side of the square may be ½ of the wavelength of the light from the light source. In an embodiment of the present invention, the side of the square may be ¼ of the wavelength of the light from the light source. In an embodiment of the present invention, the side of the square may be ⅒ of the wavelength of the light from the light source. In an embodiment of the present invention, the side of the square may be ⅓₀ of the wavelength of the light from the light source.

The size of the element 1010, 1030 with a square shape on the mask 10 may depend on the length of the side. In an embodiment of the present invention, the side of the square may be 90-110 nm. In an embodiment of the present invention, the side of the square may be 55-65 nm. In an embodiment of the present invention, the side of the square may be 30-40 nm. In an embodiment of the present invention, the side of the square may be 15-25 nm.

In an embodiment of the present invention, the mask 10 may include elements arranged in an array (or matrix), such as in rows and columns, with each position in the array occupied by an element having a uniform shape, a uniform size, and discrete states.

In an embodiment of the present invention, two discrete states may be available for each element. In an embodiment of the present invention, three discrete states may be available for each element. In an embodiment of the present invention, a continuous or semi-continuous spectrum of discrete states may be available for each element.

In an embodiment of the present invention, the opaque element 1010 may be surrounded by one or more clear elements in the mask 10. In an embodiment of the present invention, the clear element, such as the translucent element (not shown) or the transparent element 1030, may be surrounded by one or more opaque elements in the mask 10.

The element with a square shape may share a common side with four neighboring elements. The element with a square shape may share a common corner with another four neighboring elements. In an embodiment of the present invention, the element on the mask 10 may be surrounded by 8 neighboring elements, each of which may be opaque or clear.

In an embodiment of the present invention, the mask 10 may include opaque elements and clear elements in all portions (or locations) of the mask 10. In an embodiment of the present invention, the mask 10 may include opaque elements and clear elements in most portions (or locations) of the mask 10. In an embodiment of the present invention, the mask 10 may include opaque elements and clear elements in certain portions (or locations) of the mask. In an embodiment of the present invention, the mask 10 may include opaque elements and clear elements only in certain portions (or locations) of the mask that correspond to (or are near to) a corner.

The corner may include an outside corner or an inside corner. An outside corner involves two edges of a feature that meet with an angle that is more than 180 degrees. An inside corner involves two edges of a feature that meet with an angle that is less than 180 degrees. No corner is present when two edges of a feature meet with an angle of 180 degrees.

A first outside corner may be near a second outside corner. The first outside corner and the second outside corner may be facing each other. The first outside corner and the second outside corner may be facing in the same direction. The first outside corner and the second outside corner may be nested.

A first inside corner may be near a second inside corner. The first inside corner and the second inside corner may be facing each other. The first inside corner and the second inside corner may be facing in the same direction. The first inside corner and the second inside corner may be nested.

An outside corner may be near an inside corner. The outside corner and the inside outside corner may be facing each other. The outside corner and the inside corner may be facing in the same direction. The outside corner and the inside corner may be nested.

A wafer may be coated with a photoresist film that is exposed in the scanner to light originally provided by the light source and subsequently modulated by the mask 10. After modulation by the array (or matrix) of elements in the mask 10, the light that emanates from the projection optics will form an aerial image.

The mask 10 may be used in the scanner to expose a latent image, such as of a shallow trench isolation (STI) layer, in the photoresist film. The latent image in the photoresist film may extend across portions of the source region(s), the drain region(s), or the gate(s) of the device(s) in the chip.

After undergoing a develop process, the latent image in the photoresist film may be transformed into a pattern in the photoresist film coated on the wafer. The pattern in the photoresist film may extend across portions of the source region(s), the drain region(s), or the gate(s) of the device(s) in the chip.

The pattern in the photoresist film after the develop process may not precisely match the array of elements in the mask 10. Imprecision may be manifested in various ways, such as print bias, isolated feature versus dense (nested) feature bias, horizontal feature versus vertical feature bias, critical dimension (CD) or linewidth non-uniformity, line edge roughness (LER), pattern collapse, image distortion, misregistration, or imperfect overlay. The reduction in fidelity may include rounding of a corner. In an embodiment of the present invention, the corner that is rounded may be an outside corner. In an embodiment of the present invention, the corner that is rounded may be an inside corner.

After going through an etch process, the pattern in the photoresist film may be transferred into features in the wafer underlying the photoresist film. The pattern in the photoresist film may extend across portions of the source region(s), the drain region(s), or the gate(s) of the device(s) in the chip.

The features in the wafer after the etch process may not precisely match the pattern in the photoresist film. Imprecision may be manifested in various ways, such as etch bias, overhang (T-top), undercut (foot), surface roughness, or redeposition (polymer). The imprecision may be related to low etch selectivity, shadowing, etch loading, and any overetch that was performed. The reduction in fidelity may include rounding of a corner. In an embodiment of the present invention, the corner that is rounded may be an outside corner. In an embodiment of the present invention, the corner that is rounded may be an inside corner.

The wafer may include chips having devices with integrated circuits. In an embodiment of the present invention, the device(s) on the wafer may include source region(s), drain region(s), and gate(s).

Figure 2A:
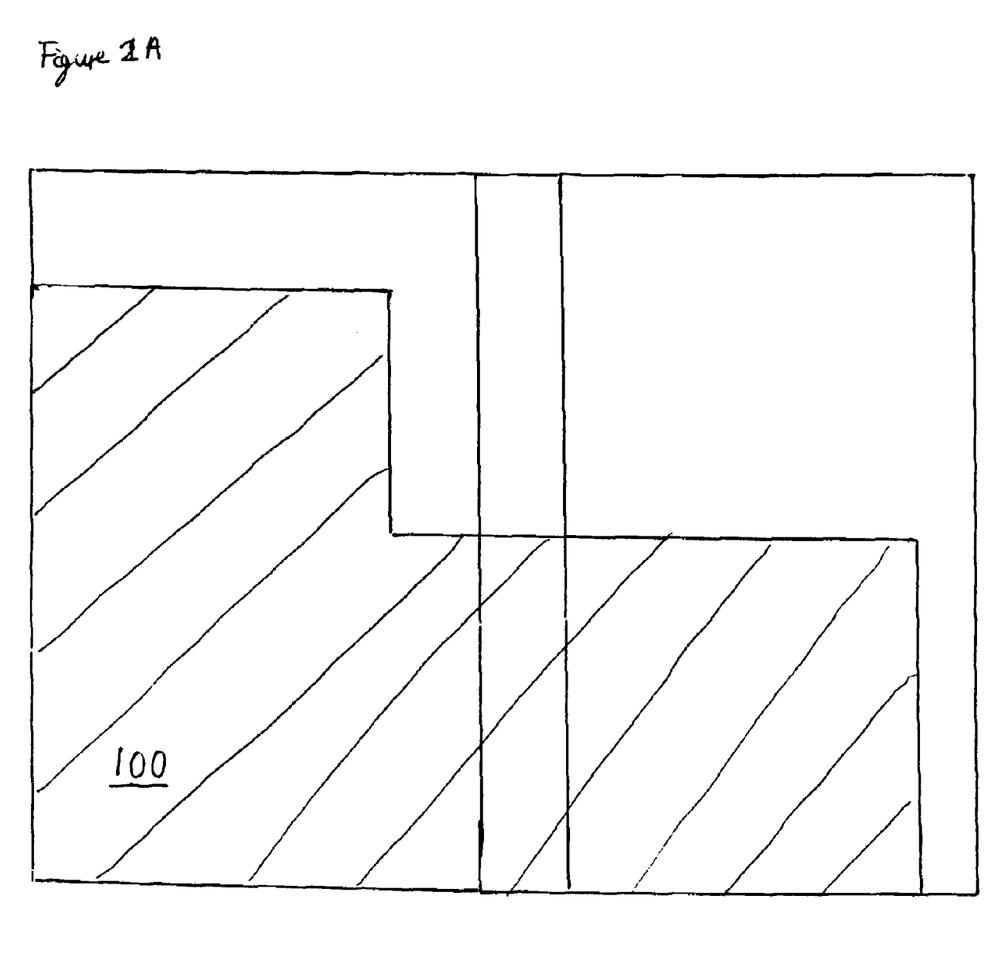
FIGS. 2A-2B are illustrations of a first layer and a second layer according to an embodiment of the present invention.

FIG. 2A shows a desired pattern for an isolation, such as a shallow trench isolation (STI), layer 100 in an embodiment of the present invention. The gate layer is only shown to indicate their relative placement.

Figure 2B:
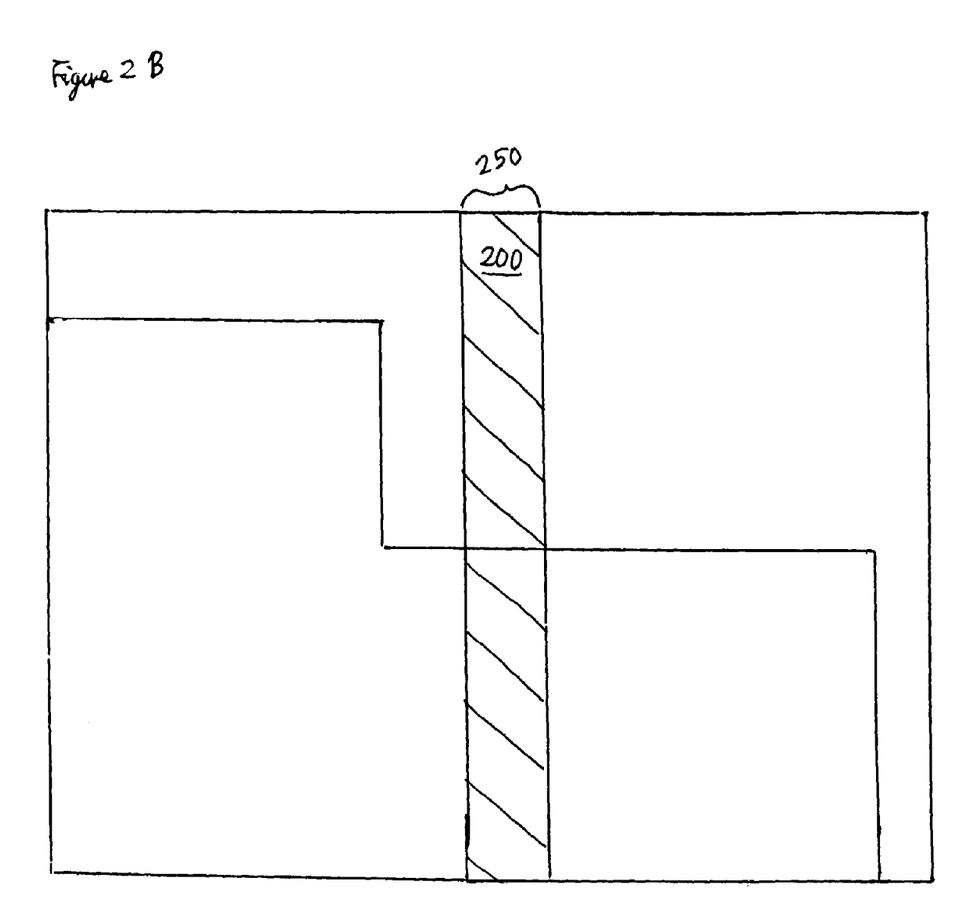

FIG. 2B shows a desired pattern for a gate 200 layer in an embodiment of the present invention. The gate 200 has a width 250. The isolation layer is only shown to indicate their relative placement.

Figure 3A:
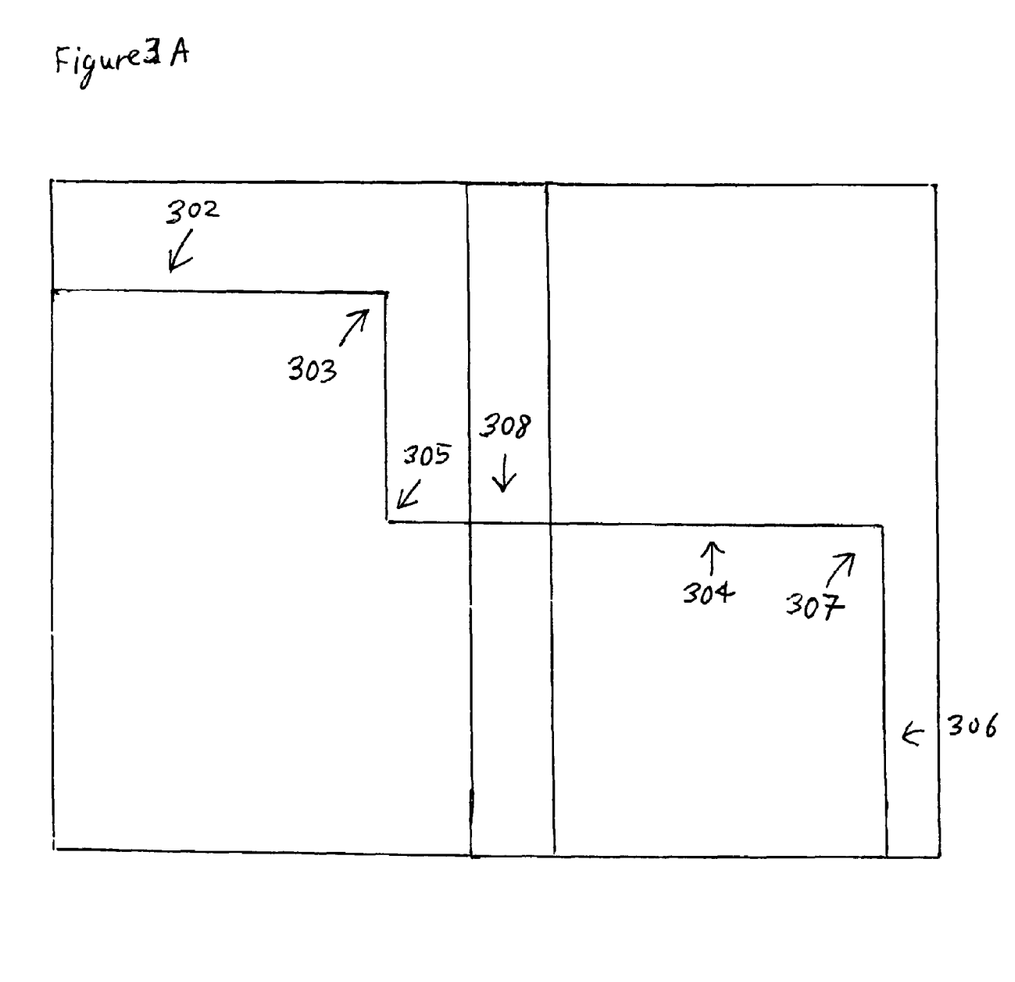
FIGS. 3A-3D are illustrations of corner rounding according to various embodiments of the present invention.

FIG. 3A shows horizontal edge 302, 304, vertical edge 306, outside corner 303, 307, inside corner 305, and overlap 308. The definition of horizontal versus vertical may depend on the orientation. The definition of outside versus inside may depend on the polarity (brightfield or darkfield) of the mask. The definition of outside versus inside may depend on the tone (positive or negative) of the photoresist.

Figure 3B:
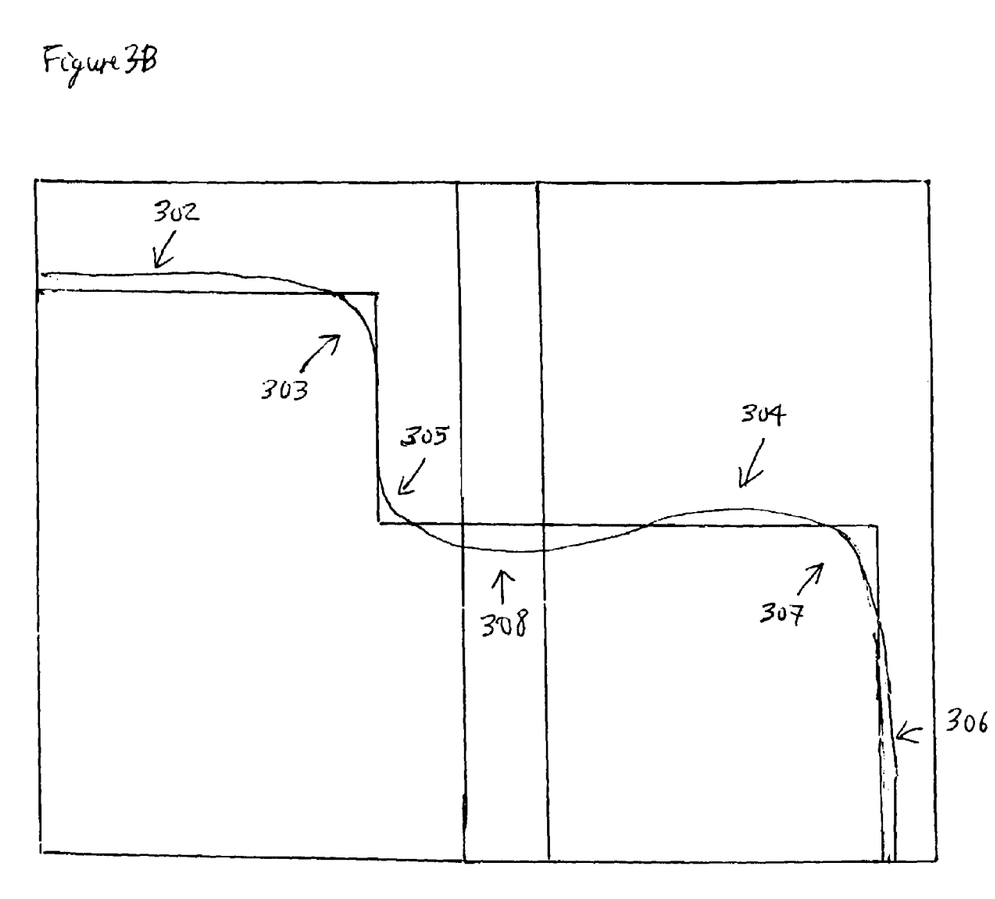

FIG. 3B shows an actual pattern (after develop or after etch) with corner rounding at outside corner 303, 307 and inside corner 305 that has been reduced (usually desirable). However, the fidelity for horizontal edge 302, 304 and vertical edge 306 is imprecise (usually undesirable). Furthermore, the overlap 308 is too small (usually undesirable).

Figure 3C:
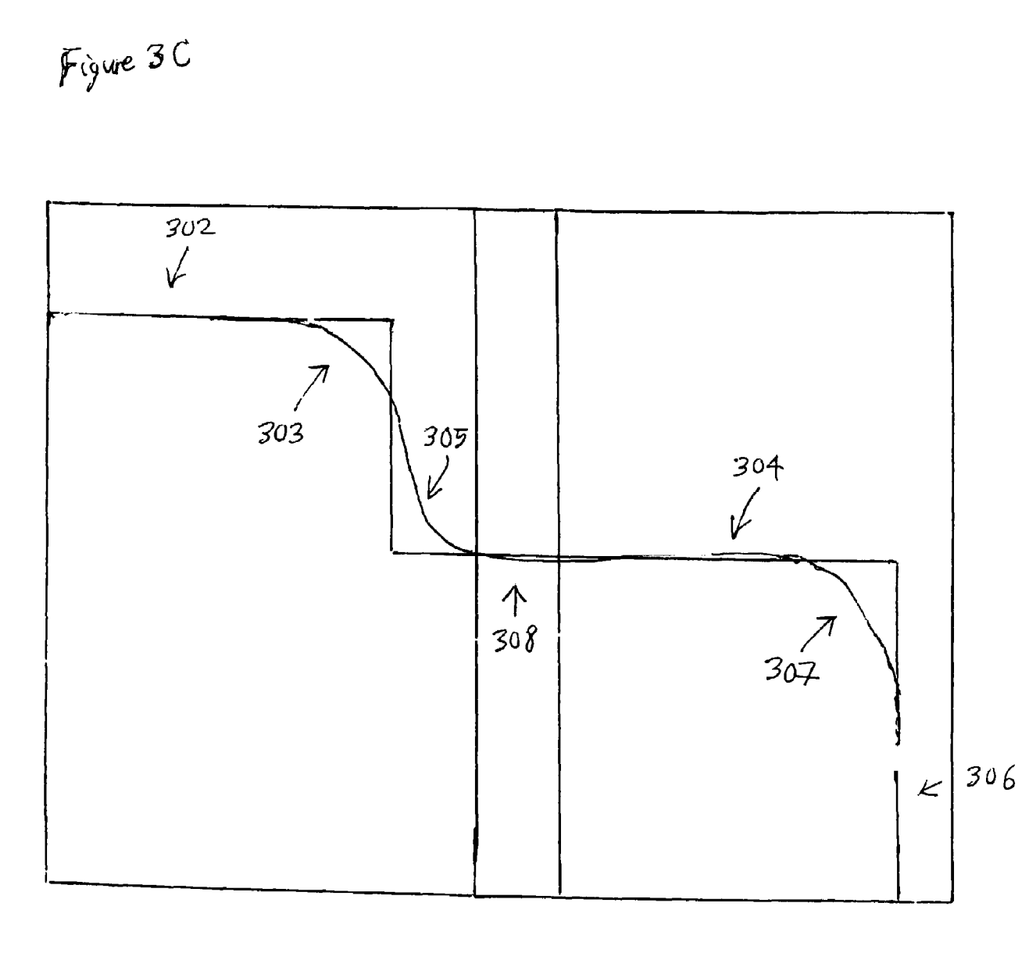

FIG. 3C shows an actual pattern (after develop or after etch) with corner rounding at outside corner 303, 307 and inside corner 305 that is excessive (usually undesirable). However, the fidelity for horizontal edge 302, 304 and vertical edge 306 is precise (usually desirable). Furthermore, the overlap 308 is also precise (usually desirable).

Figure 3D:
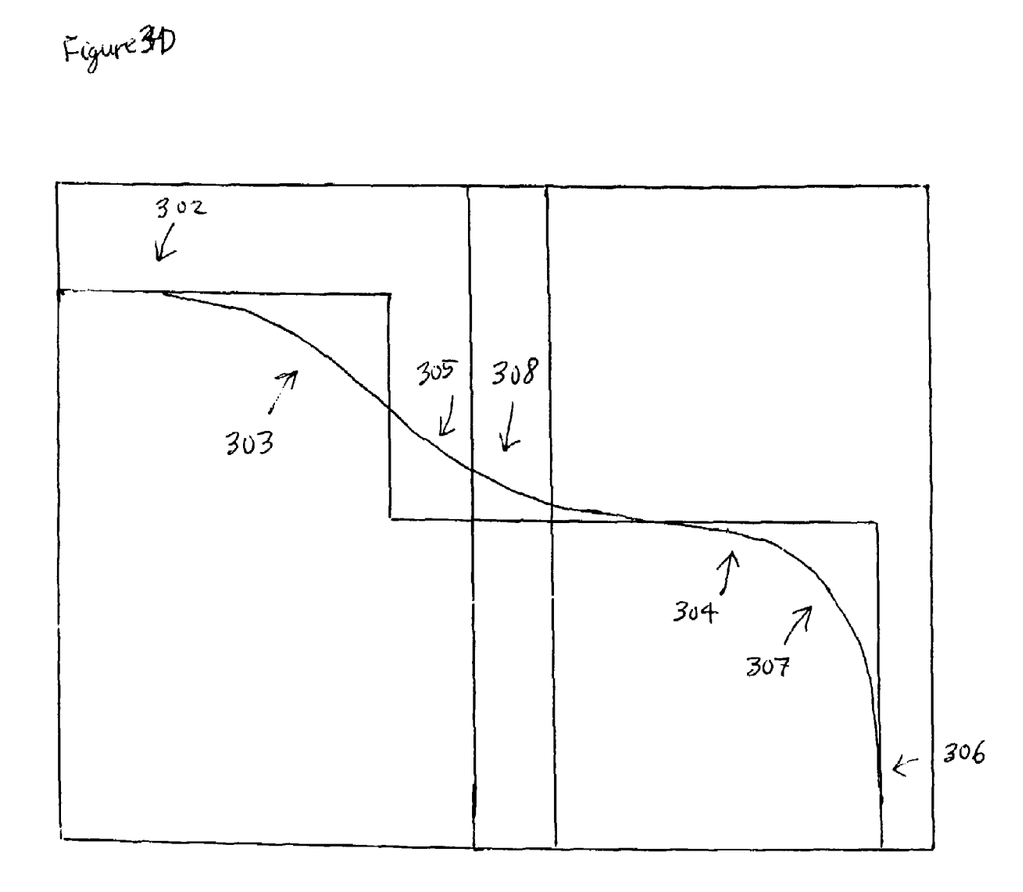

FIG. 3D shows an actual pattern (after develop or after etch) with corner rounding at outside corner 303, 307 and inside corner 305 that is excessive (usually undesirable). The fidelity for horizontal edge 302, 304 and vertical edge 306 is imprecise (usually undesirable). Furthermore, the overlap 308 is too large (usually undesirable).

In an embodiment of the present invention, the choice of which actual pattern may be the most desirable may depend on balancing the requirements for device performance, device reliability, ease of design and layout, or manufacturing yield.

Figure 4:
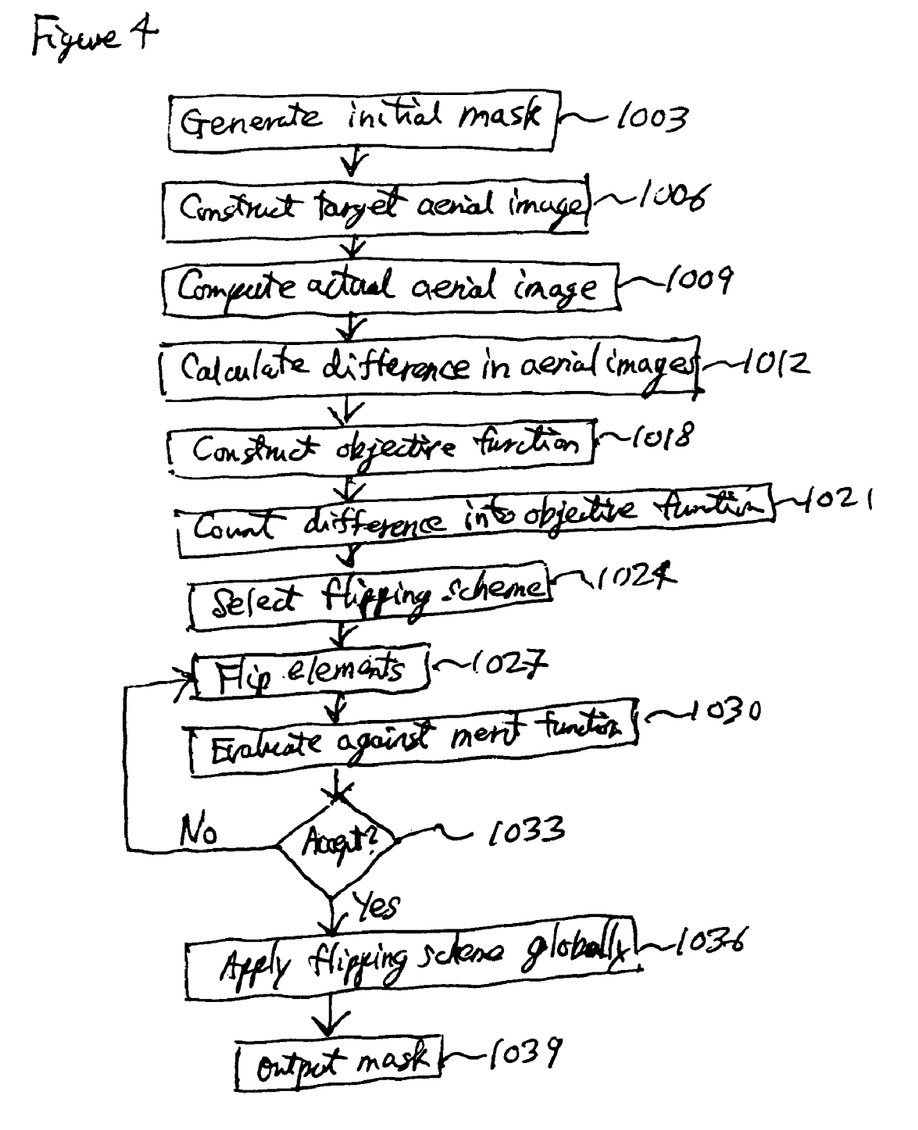
FIG. 4 is an illustration of a flow chart for designing a mask with sub-wavelength diffractive elements to reduce corner rounding according to an embodiment of the present invention.

FIG. 4 shows a flowchart for a process to design a mask 10 according to an embodiment of the present invention. The mask design process begins with generating an initial mask such as a binary mask, at box 1003.

A layout for an initial mask may be generated by using sub-wavelength diffractive elements to form a phase-colored drawn layout. For faster convergence toward the target pattern and therefore faster mask synthesis, the initial mask should be as close to the target pattern as possible.

In an embodiment of the present invention, the initial mask may be generated by phase coloring the drawn mask layout using a phase coloring operation to assign different phases for neighboring elements, such as polygons. Then, only the phase-conflicted elements, such as squares, are flipped. Flipping an element means changing its value from one state to another state. Next, an actual aerial image is constructed and a merit function is evaluated. Finally, the coloring scheme corresponding to the minimum merit function value is selected as the initial condition.

A target aerial image may be constructed, at box 1006, such as by convolving the drawn layout with a square window function.

At box 1009, an actual aerial image is computed from the mask that was determined from the element-flipping operation described above. The element-flipped matrix may be convolved with a kernel function to determine the electromagnetic (EM) field at all positions on the wafer that are exposed to light through the mask. A square of the EM field is known as an intensity. If the intensity exceeds a certain threshold value then the portion of the photoresist film coated over the wafer that is exposed to light may subsequently be developed.

The kernel function depends on the scanner or stepper with which the mask 10 will be used. The kernel function may take into consideration the nature of the light source, the effects of a collector, the type of mask 10 that is to be used, the geometry of the environmental chamber around the scanner, and the physical characteristics of the wafer that is to be processed.

Then, at box 1012, the difference between the actual aerial image, computed from the initial mask, and the target aerial image is calculated.

An objective function based on a convolution is constructed at box 1018.

The objective function may be specialized. In an embodiment of the present invention, the objective function may be selected to include sub-wavelength elements across the entire mask 10. In an embodiment of the present invention, the objection function may be selected to include sub-wavelength elements only in certain portions of the mask 10. In an embodiment of the present invention, the objection function may be selected to include sub-wavelength elements near one or more corners of one or more features on the mask.

The objective function may be selected to produce good fidelity (match) near a corner of a feature, such as of a developed contour in the photoresist film (or of an etched contour in the wafer) with a drawn design (or a structure formed on the mask). In an embodiment of the present invention, an inadequate match may result in too small overlap of a first feature on a first layer with a second feature on a second layer. In an embodiment of the present invention, an inadequate match may result in too large overlap of a first feature on a first layer with a second feature on a second layer.

In an embodiment of the present invention, good fidelity (match) includes a corner that is sharper. The sharper corner has a smaller radius of curvature.

In an embodiment of the present invention, a better match includes a corner that is less displaced laterally. The displacement may be manifested as a shortening, such as of a line.

In an embodiment of the present invention, a lateral displacement may be manifested together with rounding. In an embodiment of the present invention, a better match includes a corner that is sharper and less displaced laterally.

The difference between the actual aerial image and the target aerial image is counted into the objective function at box 1021, based on the evaluation location. The objective function is calculated by summing up all the differences from box 1012. The opaque regions and the clear (transparent and translucent) regions may receive different treatments in this operation.

Next, an element-flipping scheme to flip an element one-by-one or to flip multiple elements as a block is selected at box 1024. A group of elements flipped together may be denoted as a block flip.

Element-flipping schemes include, but are not limited to, the following:

(a) different block sizes flipped with maximum size that is fixed;

(b) different block sizes flipped with maximum size that varies with iteration;

(c) random set of elements flipped as a group;

(d) objective-weighted blocks flipped;

(e) context-weighted line block with maximum limit decreasing with iteration;

(f) context-weighted rectangular block with maximum limit decreasing with iteration;

(g) iterated initial conditions;

(h) single or block element flipped with the center element selected with random walk at every iteration;

(i) single or block element flipped with the center element selected with spiral walk starting from the center of the chip;

(j) single or block element flipped with the selection order for the center element dependent on its contribution to change in an objective function by the element in the previous iteration;

(k) single or block element flipped (as above) on a few selected masks that are selected based on the objective function from a population of masks created using the Genetic Algorithm (GA)-based principles of mutation and crossover of the masks from the previous iteration; and (l) element flipped on a population of masks created by randomly flipping partitions of masks from the previous iteration, where partitions are formed by structures in the masks along with their neighborhood.

At box 1024, any one or more of the element-flipping schemes described above may be selected. The selection of element flipping schemes may be tailored to account for a variety of different constraints in manufacturing the mask 10.

At box 1027, the elements are flipped, either one at a time or in blocks, according to the selected element-flipping scheme. Blocks of elements are flipped at box 1027 according to a scheme that has been selected. The element-flipping schemes may vary in traversal order, which determines the sequence of elements to be flipped.

In sequential traversal order, the elements to be flipped are selected in a deterministic order, such as by rows or columns, or such as along the x-axis or along the y-axis. Following a sequential traversal order may provide faster convergence for synthesizing the mask.

In random traversal order, the elements to be flipped are determined randomly (or pseudo-randomly). Following a random (or pseudorandom) traversal order may provide a more global solution for synthesizing the mask.

In one embodiment, a small portion of the mask 10 is synthesized and the element flipping at box 1027 is applied only to the elements in that portion of the mask 10. The particular elements to be flipped depend on the element-flipping scheme that is selected. If the selected element-flipping scheme works well in that portion of the mask 10, then it may be applied to the rest of the mask 10. Initially working on just a small portion of the mask 10 permits a quicker determination of a good element-flipping scheme or a good combination of element-flipping schemes. The element-flipping schemes are selected with an aim to achieve a faster convergence of the mask synthesis with the target aerial image so that the scheme may subsequently be applied to the entire mask 10.

At box 1030, the synthesized mask after one or more elements are flipped is evaluated against a merit function. Conventional merit functions may be used or the function may be weighted.

In one embodiment, through-focus behavior for the wafer in the scanner may be taken into account. The through-focus behavior depends on the accuracy of the focusing system for the scanner used in processing the wafer. Since the automatic focusing system cannot ensure that light will be perfectly focused on the wafer during production, the image of the mask 10 on the wafer may be blurred.

A through-focus merit function may be calculated for a synthesized mask as a weighted summation of individual merit functions at discrete focus points. The weights may be distributed through focus in a uniform way, or in a Gaussian distribution, or in other ways depending on the scanner and the accuracy desired.

Another effect which may be compensated for in the merit function evaluation includes a thick-mask effect. When the mask 10 is very thick compared to the wavelength of the exposure light, the light may be diffracted as it passes through the mask 10. In an embodiment of the present invention, a mask coating may be approximately 100 nm thick, while the exposure light may have a wavelength of 248 nm, 193 nm, or 157 nm.

In an embodiment of the present invention, the merit function is calculated based on a synthesized mask that takes multiple effects into consideration. Other effects not described herein may be accommodated. The mask 10 may be synthesized in a variety of different ways for comparison with the target image. An approach is to calculate only the changes from the last synthesized mask.

Based on the application of the merit function, the synthesized mask is either rejected at box 1033 or accepted. If the synthesized mask is rejected, then the flow returns to box 1027 to flip another block of elements.

However, once the synthesized mask is accepted, the selected element flipping scheme is applied globally to the entire mask 10 at box 1036.

Then, a final mask 10 is output at box 1039. The mask 10 may be used for photolithography to produce a chip that includes devices having integrated circuits.

In an embodiment of the present invention, accuracy may be enhanced by making separate exposures with multiple masks. In an embodiment of the present invention, a set of two masks may be designed and used.

Dual phase-shifting masks (PSMs) permit greater flexibility in designing the masks by decoupling certain aspects of the features in a pattern to be printed. In an embodiment of the present invention, a set of masks may include a mask 1 and a mask 2.

The dual PSMs should work together to accomplish at least four functions: (i) print critical features in the pattern; (ii) print non-critical features in the pattern; (iii) protect desirable portions of the critical features and the non-critical features that have been printed; and (c) remove artifacts that have been unavoidably printed.

An embodiment of the present invention encompasses an apparatus, such as an integrated system made up of various components, for designing the set of one or more masks by using:

(1) a method to determine the initial layout for the set of masks that may be as close as possible to the optimal solution;

(2) a convolution-based objective function to evaluate the merit of a corner of a feature on a mask;

(3) a variety of schemes to determine how to flip a group of elements (block-flip) to achieve fast convergence of mask synthesis and globality of the solution;

(4) a method to perform constrained element optimization of a corner of a feature of a mask, to take into account mask manufacturing limitations;

(5) an element traversal order, such as a sequential traversal order or a random traversal order, to determine the sequence of elements to be optimized;

(6) a method to synthesize the mask for optimal through-focus behavior;

(7) a mask model, such as a thick-mask model, to compute the diffracted EM fields resulting from the mask; and (8) an imaging model, such as a pertubative imaging model.

The mask optimization process may include the integrated system described above. In an embodiment of the present invention, one or more of the components described above may not be necessary. In an embodiment of the present invention, other components not described above may be included. In an embodiment of the present invention, one or more of the components should be selected to produce a fast and accurate design, such as of dual element masks.

An embodiment of the present invention, such as the integrated system made up of various components, may be provided as a computer program product which may include a machine-readable medium having stored thereon instructions which may be used to program a computer or other electronic device to perform a process.

The machine-readable media may include, but are not limited to, non-volatile media, such as magnetic or optical disks, volatile media, such as dynamic memory, and transmission media, such as coaxial cables, copper wires, or fiber optics. Transmission media may also take the form of acoustic waves or light waves, such as those generated during radio-wave or infra-red data communication.

Common forms of machine-readable media include floppy diskettes, hard disks, magnetic tapes, optical disks, magneto-optical disks, CD-ROMs, RAMs, ROMs, PROMs, EPROMs, EEPROMs, flash memory, magnetic or optical cards, memory sticks, and USB flash drives.

An embodiment of the present invention may be downloaded as a computer program product, wherein the program may be transferred from a remote computer to a requesting computer by way of data signals embodied in a carrier wave or other propagation medium via a communication link, such as a modem or a network connection.

The present invention may be implemented on a computer that includes a communication means, such as a bus, for communicating information. The bus may be point-to-point or chip-to-chip.

The computer includes a processing means, such as a processor, coupled to the bus for processing information. The processor may include a single core or multiple cores.

The computer includes a main memory, such as a random access memory (RAM) or other dynamic storage device, coupled to the bus for storing information and instructions. The dynamic storage device may be refreshed as needed. The main memory is used for storing temporary variables or other intermediate information during execution of instructions by the processor.

The computer includes a nonvolatile memory, such as a read only memory (ROM) or other static storage device, coupled to the bus for storing information and instructions to be executed by the processor.

A mass storage device, such as a magnetic disk or optical disc and its corresponding drive, is coupled to the bus for storing information and instructions.

The computer may include a memory controller. The memory controller may be integrated with the processor or may be separated from the processor, such as integrated into a chip set that may accompany the processor.

A display device, such as a cathode ray tube (CRT) monitor or a liquid crystal display (LCD) monitor, is coupled, via the bus, to the computer for displaying information to a user. Graphical and textual indications of installation status, operations status, and other information is presented to the user on the display device.

A user input device, such as a keyboard, including alphanumeric, function, and other keys, is coupled to the bus for communicating information and command selections to the processor.

A cursor control, such as a mouse, a trackball, or cursor direction keys, is coupled to the bus for communicating direction information and command selections to the processor and for controlling cursor movement on the display.

A communication interface, such as a modem, a network interface card, is coupled to the bus. The communication interface provides a two-way communication coupling to an Ethernet, a token ring, or other type of network link for connecting to other devices via a network, such as a local area network (LAN) or a wide area network (WAN). The computer may be coupled to clients or servers or a host computer via a network infrastructure, such as an intranet or the Internet.

A wireless link may also be implemented in which the communication interface sends and receives electrical, electromagnetic, or optical signals that carry analog or digital data streams representing various types of information.

The computer may send and receive data, including program code, through the communication interface, the network link, and the network.

It is to be appreciated that a lesser or more equipped computer than described above may be used for certain implementations. The configuration may vary depending upon certain factors, such as price constraints, performance requirements, or technological improvements.

Embodiments of the present invention may be applied to other types of tools, including wafer scanners, which may use different materials and devices than those shown and described herein.

It is further to be appreciated that a less or more complex aerial image, element function set, merit function, comparison process, and new mask determination than those shown and described herein may be used.

Multiple embodiments and specific details have been set forth above to provide a thorough understanding of the present invention. One skilled in the art will realize that certain of the features in one embodiment may be equally applicable to other embodiments. One skilled in the art will also appreciate the ability to make other equivalent substitutions for those specific materials, processes, dimensions, and concentrations described herein. In other instances, well-known circuits, structures and techniques have not been shown in detail to avoid obscuring the understanding of this description. It is to be understood that the detailed description of the present invention should be regarded as illustrative and not limiting, wherein the scope of the present invention should be determined by the claims that follow.

Thus, we have described a mask with sub-wavelength diffractive elements to reduce corner rounding and a method of designing such a mask with sub-wavelength diffractive elements to reduce corner rounding.

We claim:

1. A mask comprising:
   a first region near a corner of a feature, said first region comprising a first element, said first element being transparent to a light, said first element having a side that is smaller than a wavelength of said light;
   a second region near said corner of said feature, said second region comprising a second element, said second element being transparent to said light, said second element having a side that is smaller than said wavelength of said light; and
   a third region near said corner of said feature, said third region comprising a third element, said third element being opaque to said light, said third element having a side that is smaller than said wavelength of said light
   wherein said first element, said second element, and said third element each has a square shape.

2. The mask of claim 1 wherein said first element comprises a phase of zero degree.

3. The mask of claim 1 wherein said second element comprises a phase of 180 degrees.

4. The mask of claim 1 wherein said first element comprises a transmittance of 99%.

5. The mask of claim 1 wherein said second element comprises a transmittance of 12%.

6. The mask of claim 1 wherein said third element comprises a transmittance of 1%.

7. The mask of claim 1 wherein said first element, said second element, and said third element have a uniform shape, a uniform size, and discrete states.

8. The mask of claim 1 wherein said first element is surrounded by 8 neighboring elements.

9. The mask of claim 1 wherein said wavelength of light comprises 193 nanometers.

10. The mask of claim 1 wherein said side may be 35-70% of said wavelength of said light.

11. The mask of claim 1 wherein said side may be ½ of said wavelength of said light.

12. The mask of claim 1 wherein said side may be 90-110 nm.

* * * * *

UNITED STATES PATENT AND TRADEMARK OFFICE
CERTIFICATE OF CORRECTION

PATENT NO. : 7,611,806 B2  
APPLICATION NO. : 11/242166  
DATED : November 3, 2009  
INVENTOR(S) : Baidya et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1034 days.

Signed and Sealed this

Twelfth Day of October, 2010

David J. Kappos  
*Director of the United States Patent and Trademark Office*